US008531192B2

(12) United States Patent
Zeleznik

(10) Patent No.: US 8,531,192 B2
(45) Date of Patent: Sep. 10, 2013

(54) HIGH-IMPEDANCE MEMS SWITCH

(75) Inventor: Matthew A. Zeleznik, Pittsburgh, PA (US)

(73) Assignee: Robert Bosch GmbH, Stuttgart (DE)

( * ) Notice: Subject to any disclaimer, the term of this patent is extended or adjusted under 35 U.S.C. 154(b) by 333 days.

(21) Appl. No.: 13/087,625

(22) Filed: Apr. 15, 2011

(65) Prior Publication Data

US 2012/0262192 A1 Oct. 18, 2012

(51) Int. Cl.
*G01R 27/26* (2006.01)

(52) U.S. Cl.
USPC .......................................................... 324/658

(58) Field of Classification Search
None
See application file for complete search history.

(56) References Cited

U.S. PATENT DOCUMENTS

| | | | | |
|---|---|---|---|---|
| 5,343,766 | A | 9/1994 | Lee | |
| 6,396,368 | B1 | 5/2002 | Chow et al. | |
| 6,480,645 | B1 | 11/2002 | Peale et al. | |
| 6,529,093 | B2 * | 3/2003 | Ma | 333/101 |
| 6,798,315 | B2 * | 9/2004 | Schaefer | 333/105 |
| 7,671,397 | B2 | 3/2010 | Fujita et al. | |
| 7,749,792 | B2 | 7/2010 | Fedder et al. | |
| 2004/0119126 | A1 * | 6/2004 | Chen et al. | 257/415 |
| 2007/0158775 | A1 * | 7/2007 | Cunningham et al. | 257/467 |
| 2009/0161890 | A1 | 6/2009 | Lin | |
| 2010/0193884 | A1 | 8/2010 | Park et al. | |
| 2010/0289772 | A1 | 11/2010 | Miller | |

FOREIGN PATENT DOCUMENTS

| | | |
|---|---|---|
| JP | 2006066178 | 3/2006 |
| JP | 2008224292 | 9/2008 |
| JP | 2008300284 | 12/2008 |
| WO | 2009070776 | 6/2009 |

OTHER PUBLICATIONS

Search Report from the European Patent Office for Application No. 12163452.1 dated Jul. 18, 2012 (7 pages).

* cited by examiner

*Primary Examiner* — Vinh Nguyen
(74) *Attorney, Agent, or Firm* — Michael Best & Friedrich LLP

(57) ABSTRACT

The MEMS switch has a high-impedance state and a low-impedance state for biasing a capacitive sensor, and includes an actuation bias terminal, a sense bias terminal, a switch control terminal, a sense node terminal, and a spring. The actuation bias terminal and the sense bias terminal reside in a released region of the switch. The sense bias terminal is physically coupled to the actuation bias terminal by a dielectric which electrically isolates the sense bias terminal from the actuation bias terminal. The switch control terminal is separated from the sense bias terminal by a first air gap, and the sense node terminal is separated from the sense bias terminal by a second air gap. The spring supports the actuation bias terminal, the sense bias terminal, and the dielectric.

17 Claims, 7 Drawing Sheets

HIGH-IMPEDANCE MEMS SWITCH

BACKGROUND

The invention relates to high-impedance MEMS switches, particularly for use in biasing networks for MEMS capacitive sensors.

Biasing networks for capacitive sensors (e.g., a MEMS capacitive sensor), have a low impedance state and a high-impedance state. When the biasing network is in a low impedance state, a biasing current is allowed to flow and charge a sensor capacitor. The biasing network then switches to the high-impedance state to stop the flow of current to the sensor capacitor.

SUMMARY

In one embodiment, the invention provides a MEMS switch. The MEMS switch has a high-impedance state and a low-impedance state for biasing a capacitive sensor, and includes an actuation bias terminal, a sense bias terminal, a switch control terminal, a sense node terminal, and a spring. The actuation bias terminal and the sense bias terminal reside in a released region of the switch. The sense bias terminal is physically coupled to the actuation bias terminal by a dielectric which electrically isolates the sense bias terminal from the actuation bias terminal. The switch control terminal is separated from the actuation bias terminal by a first air gap, and the sense node terminal is separated from the sense bias terminal by a second air gap. The spring supports the actuation bias terminal, the sense bias terminal, and the dielectric. When a potential is created between the actuation bias terminal and the switch control terminal the actuation bias terminal is drawn towards the switch control terminal resulting in the sense bias terminal contacting the sense node terminal.

In another embodiment the invention provides a capacitive sensor bias circuit. The circuit includes a capacitive sensor and a MEMS switch. The capacitive sensor is coupled between ground and a sense node. The MEMS switch includes an actuation bias terminal residing in a released region and coupled to a positive DC voltage, a sense bias terminal residing in the released region and physically coupled to the actuation bias terminal by a dielectric which electrically isolates the sense bias terminal from the actuation bias terminal, the sense bias terminal coupled to a bias power source, a switch control terminal separated from the actuation bias terminal by a first air gap, the switch control terminal coupled to a sense control signal source, a sense node terminal separated from the sense bias terminal by a second air gap, and coupled to the sense node, and a spring supporting the actuation bias terminal, the sense bias terminal, and the dielectric. The sense control signal source provides a ground potential to couple the bias power source to the sense node and provides the positive DC voltage to disconnect the sense node from the bias power source.

In another embodiment the invention provides a capacitive sensor bias circuit. The circuit includes a first capacitive sensor and a first MEMS switch. The first capacitive sensor is coupled between a first bias node and a sense/input node. The first MEMS switch includes a first actuation bias terminal coupled to a first DC voltage, a first sense bias terminal coupled to a first bias power source, a first switch control terminal coupled to a first sense control signal source, a sense/input node terminal coupled to the first bias node, a spring supporting the first actuation bias terminal, and the first sense bias terminal, a second actuation bias terminal coupled to a second DC source, a second sense bias terminal coupled to a second bias source, and a second switch control terminal coupled to a second sense control signal source.

Other aspects of the invention will become apparent by consideration of the detailed description and accompanying drawings.

DETAILED DESCRIPTION

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways.

Figure 1:
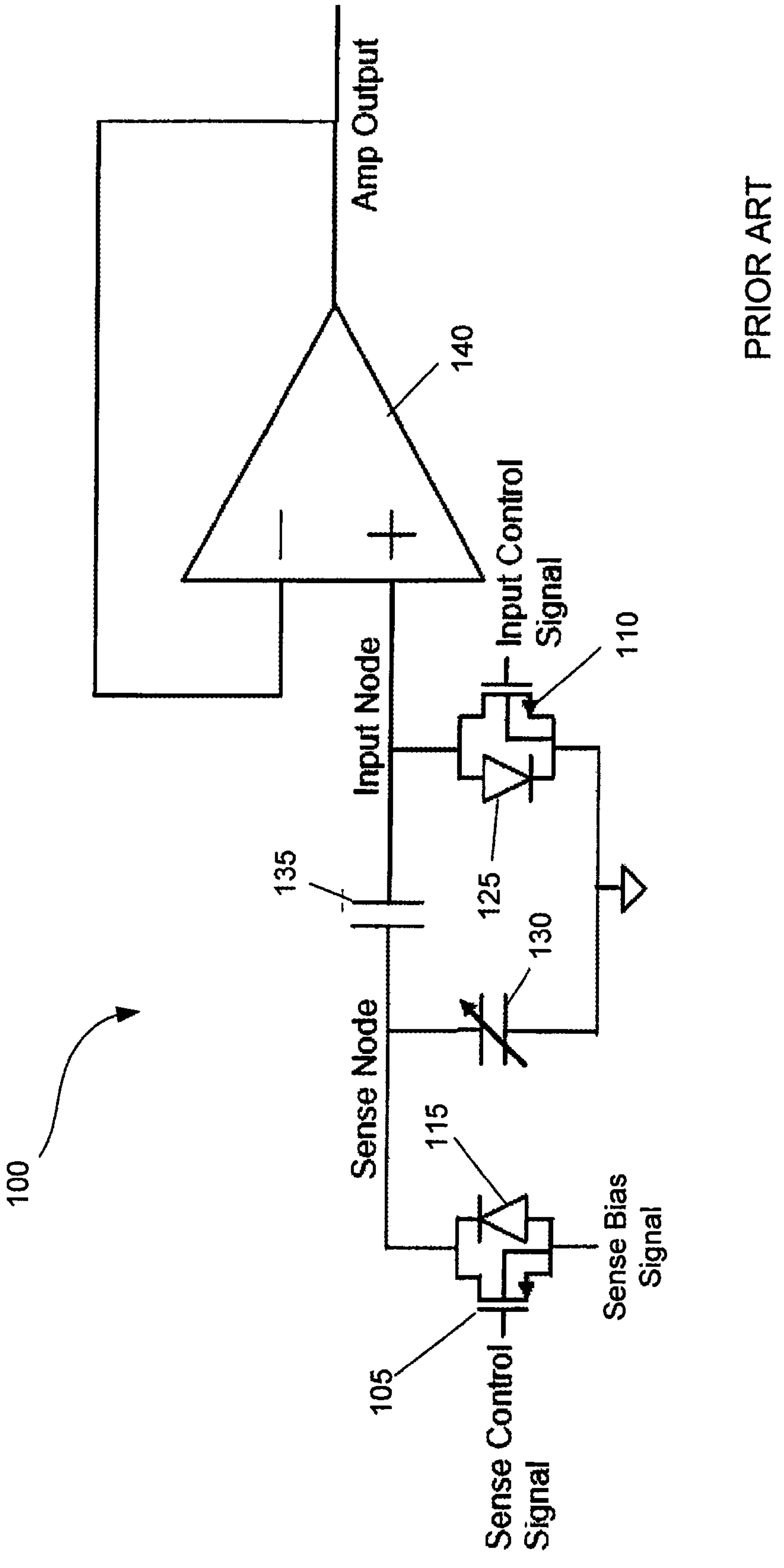
FIG. 1 is a schematic diagram of a prior-art, non-switched, continuous-time, voltage-sensing, front-end with high-voltage biasing of a sense node.

FIG. 1 shows a prior-art circuit 100 for biasing a capacitive sensor and amplifying its output. The circuit 100 includes a first MOS field effect transistor (FET) 105, a second MOS FET 110, a first diode 115, a second diode 125, a capacitive sensor 130, a coupling capacitor 135, and an amplifier 140. The first FET 105 and the second FET 110 each include a body diode.

The coupling capacitor 135 AC couples the capacitive sensor 130 (at a sense node) to the amplifier 140 (at an input node), but provides a DC open. This allows the capacitive sensor 130 to be biased at a higher voltage than the breakdown voltage of the devices at the input of the amplifier 140. The first FET 105 switches between a high-impedance state and a low impedance state based on a Sense Control Signal applied to the gate of the FET 105. In the low impedance state, a Sense Bias Signal (i.e., a bias voltage) is applied to the capacitive sensor 130. When the FET 105 is in the high-impedance state, the capacitive sensor 130 is isolated from the bias voltage, and physical motion of the capacitive sensor 130 is translated into a change in voltage on the sense node. An Input Control Signal is coupled to the gate of the second FET 110, and controls the FET 110, and operates in the same manner as the FET 105.

High signal swings at the sense and input nodes present issues in the circuit of FIG. 1. A large positive voltage signal at the sense node begins to forward bias the body diode of the first FET 105. As the voltage across the diode increases, current flows through the diode resulting in a loss of charge on the sense node causing signal distortion. In the same manner, a large negative voltage signal at the sense node begins to forward bias the diode 115. Similarly, a large negative voltage at the input node results in the charge flowing through the body diode of the second FET 110, and a large positive voltage at the input node results in the charge flowing through the diode 125.

In addition, periodic signals can create a small error in the signal gain, and a DC offset at the input. The amount of charge lost and gained with positive and negative peaks in the periodic signals are not matched because the I-V characteristics of the body diodes of the first and second FETs 105 and 110 are not matched to the I-V characteristics of the diodes 115 and 125. Thus, the net charge finds a new equilibrium at the sense node if the periodic signal is present for a sufficient amount of time, and a signal induced DC offset, which can exceed the common mode range of the amplifier or saturate downstream circuits, can be induced at the input node.

Furthermore, DC leakage currents from the sense or input node to ground causes current to flow through the body diodes of FET 105 or diode 125, lowering the impedance of the FET 105 or diode 125. The reduced impedance results in increased noise on the sense or input node.

Figure 2:
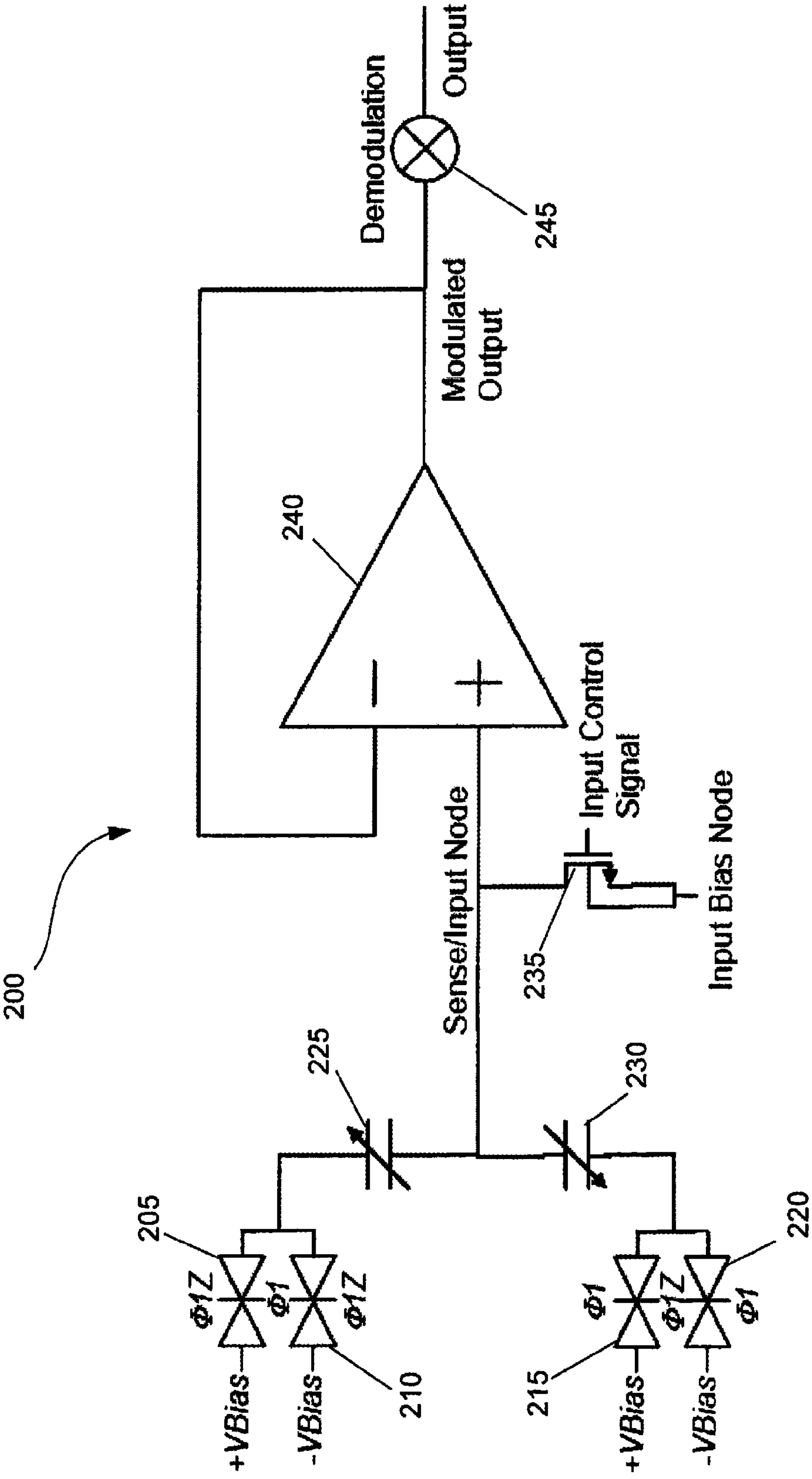
PRIOR ART Fig. 2
FIG. 2 is a schematic diagram of a prior-art, chopper-modulated, continuous-time, voltage-sensing, front-end.

FIG. 2 shows a prior-art circuit 200 where the input and sense nodes are continuously switched in a chopper-modulated scheme. The circuit 200 includes a first transmission gate 205, a second transmission gate 210, a third transmission gate 215, a fourth transmission gate 220, a first capacitive sensor 225, a second capacitive sensor 230, a FET 235, an amplifier 240, and a demodulator 245. A charge is present in the channels of the FETs comprising transmission gates 205-220 during phases of the clock ø1 when the transmission gates 205-220 are closed. When the transmission gates 205-220 open, some of the excess channel charge flows back to the bias node, and some of the charge is deposited on the input node resulting in excess charge on the sense/input node. Over many switching cycles of ø1, the excess charge on the sense/input node results in a drift of the DC bias at the sense/input node which may exceed the common mode input range of the amplifier 140. The total bias is limited to the maximum drain-source breakdown voltage of the transmission gates 205-220 because they are exposed to the frill voltage potential between $+V_{Bias}$ and $-V_{Bias}$. Large signal swings at the high-impedance node result in the same distortion as occur in the non-switched continuous-time front-end of FIG. 1.

The invention overcomes the issues presented by the MOS transistors (i.e., the FETs and the transmission gates) of the circuits 100 and 200 of FIGS. 1 and 2. In one embodiment, a CMOS-MEMS switch is used to replace the transistors in the circuits 100 and 200. Other switch fabrication technologies can be used as well. Instead of the leakage paths of the diodes and FET transistors, the CMOS-MEMS switches provide no DC path for current flow in its high-impedance state. Further, in the low-impedance state, the impedance of the CMOS-MEMS switches is equal to the resistivity of the metal of the switches and the switches' contact resistance. Also, there are no charge injection effects with the CMOS-MEMS switch because of the metallic structure of the switch.

Figure 3:
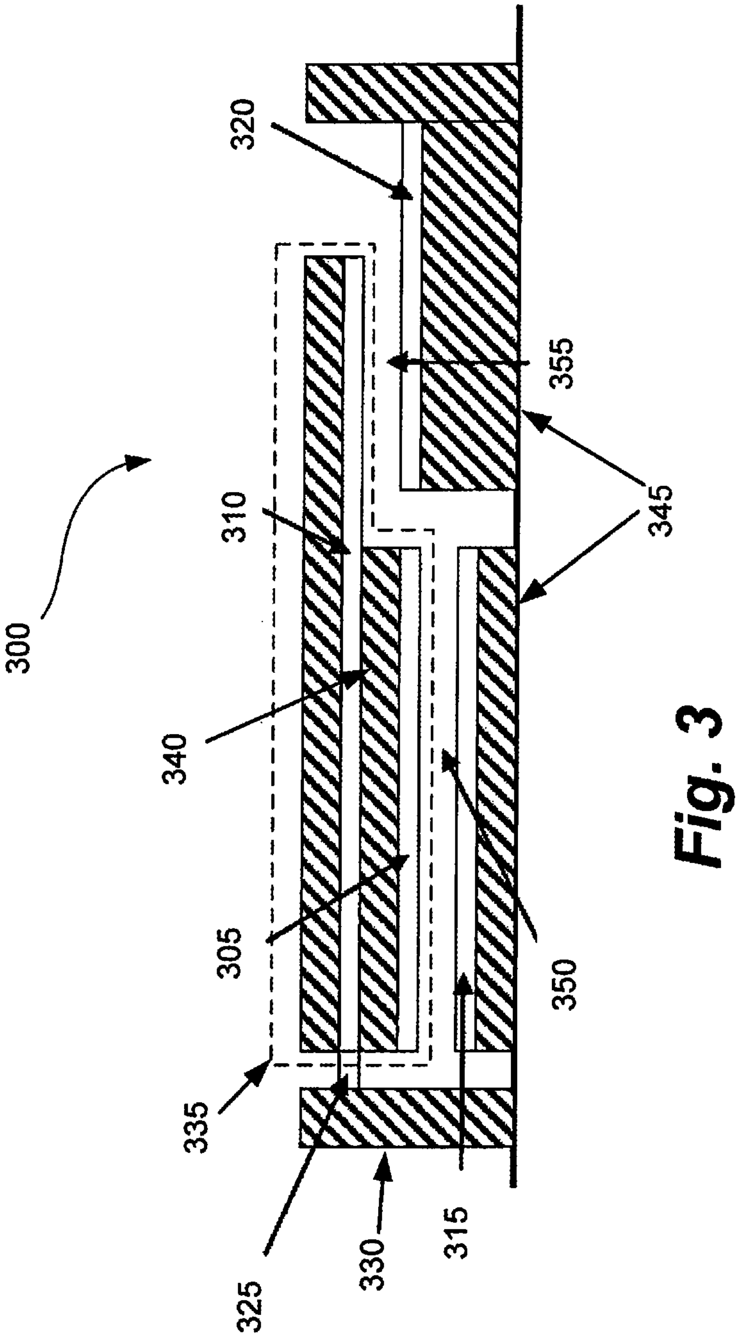
FIG. 3 is a cross-sectional view of a vertically-actuated high-impedance MEMS switch.

FIG. 3 shows a CMOS-MEMS switch 300 for use in the non-switched continuous-time front-end circuit of FIG. 1. The switch 300 includes an actuation bias terminal 305, a sense/input bias terminal 310, a switch control terminal 315, a sense/input node terminal 320, and a spring 325. The spring 325 is connected to a vertical structure or wall 330 of the switch 300. The actuation bias terminal 305 and the sense/input bias terminal 310 reside in a released section 335 of the switch 300, and are mechanically connected, but electrically isolated, by a dielectric layer 340. The switch control terminal 315 and the sense/input node terminal 320 reside in an unreleased section 345 of the switch 300. An actuation gap 350 (i.e., a first air gap) between the actuation bias terminal 305 and the switch control terminal 315 is equal to or larger than the thickness of the dielectric layer 340. The switch 300 is designed such that the switch 300 closes at a voltage less than the breakdown voltage of a MOS device controlling a switch control signal (applied to the switch control terminal 315). In operation, the actuation bias terminal 305 is supplied with a positive DC voltage. To close the switch 300, the switch control terminal 315 is set to ground. The potential between the actuation bias terminal 305 and the switch control terminal 315 pulls the actuation bias terminal 305 toward the switch control terminal 315 causing the sense/input bias terminal 310 to traverse a contact gap 355 (i.e., a second air gap) and contact the sense/input node terminal 320. To open the switch 300, the switch control terminal 315 is set to the same DC voltage as the actuation bias terminal 305. The lack of potential between the actuation bias terminal 305 and the switch control terminal 315 allows the restoring force of the spring 325 to move the actuation bias terminal 305 away from the switch control terminal 315 causing the sense/input bias terminal 301 to disconnect from the sense/input node terminal 320.

Figure 4:
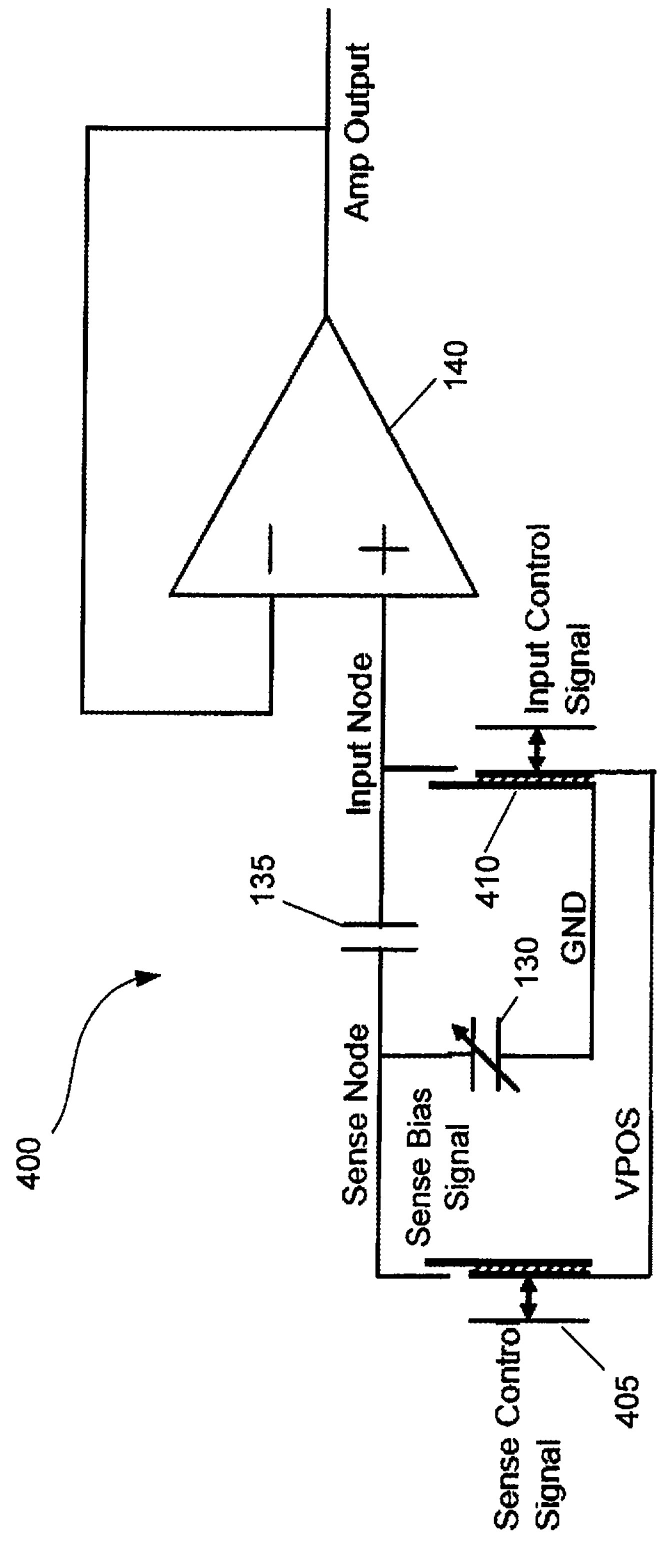
FIG. 4 is a schematic diagram of a non-switched, continuous-time, voltage-sensing, front-end with high-voltage biasing of a sense node using the switch of FIG. 3.

FIG. 4 illustrates the non-switched continuous-time front-end circuit 400. The circuit 400 is similar to the circuit 100 of FIG. 1 except switches 300 replace the FETs 105 and 110, and diodes 115 and 125. The circuit 400 includes a first switch 405, a second switch 410, a capacitive sensor 130, a coupling capacitor 135, and an amplifier 140. The Sense Control Signal is coupled to the switch control terminal of the switch 405, the Sense Bias Signal is coupled to the sense/input bias terminal of switch 405, and the sense/input node terminal is coupled to the Sense Node. With respect to the second switch 410, the Input Control Signal is coupled to the switch control terminal, ground is coupled to the sense/input bias terminal, and the sense/input node terminal is coupled to the Input Node. A positive DC voltage is applied to the actuation bias terminals of both switches 405 and 410.

Figure 5:
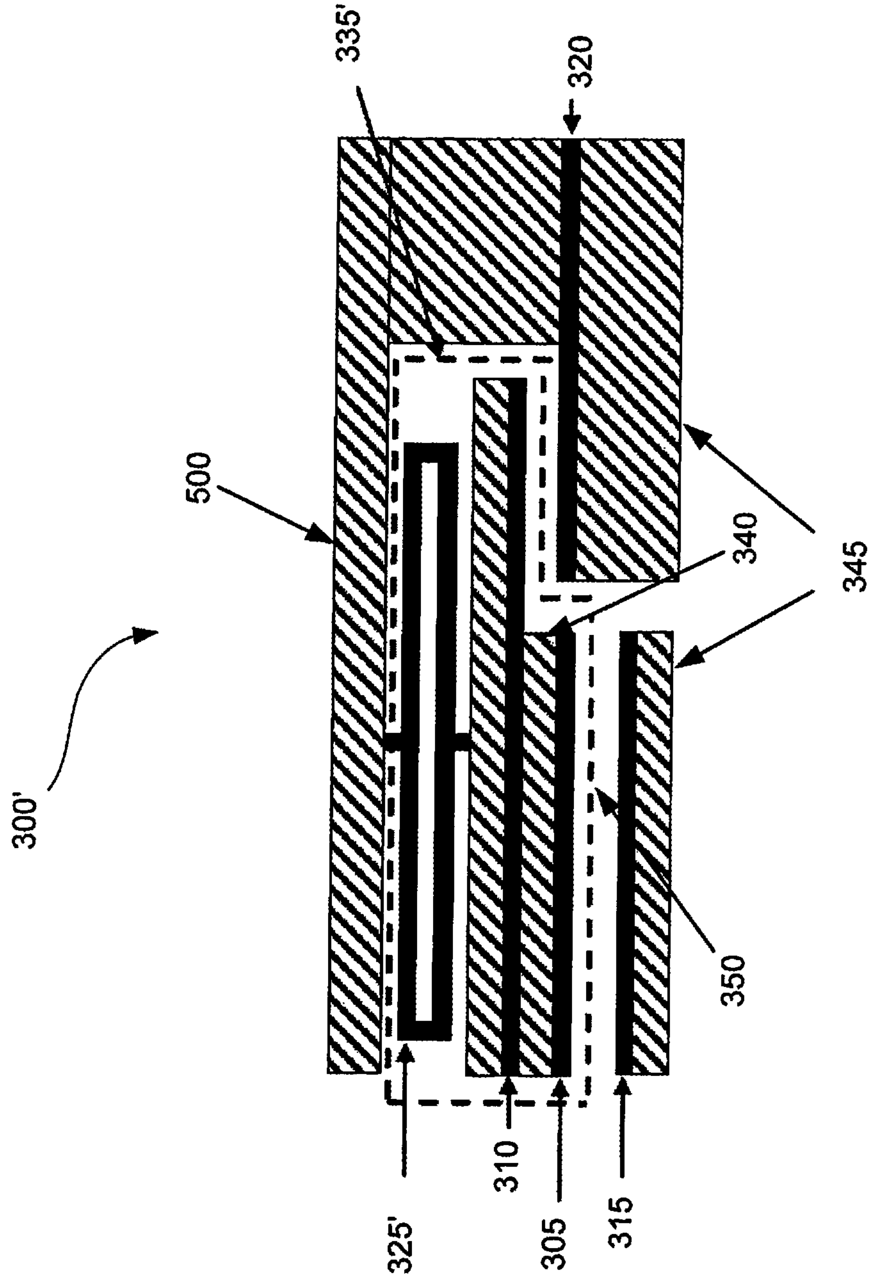
FIG. 5 is a cross-sectional view of a horizontally-actuated high-impedance MEMS switch.

FIG. 5 illustrates an alternative embodiment of switch 300. The switch 300' is structured such that the spring 325' is connected to a horizontal structure or wall 500 versus the vertical structure 330 of switch 300. Switch 300', while having a different structure than switch 300, operates the same as switch 300.

Figure 6:
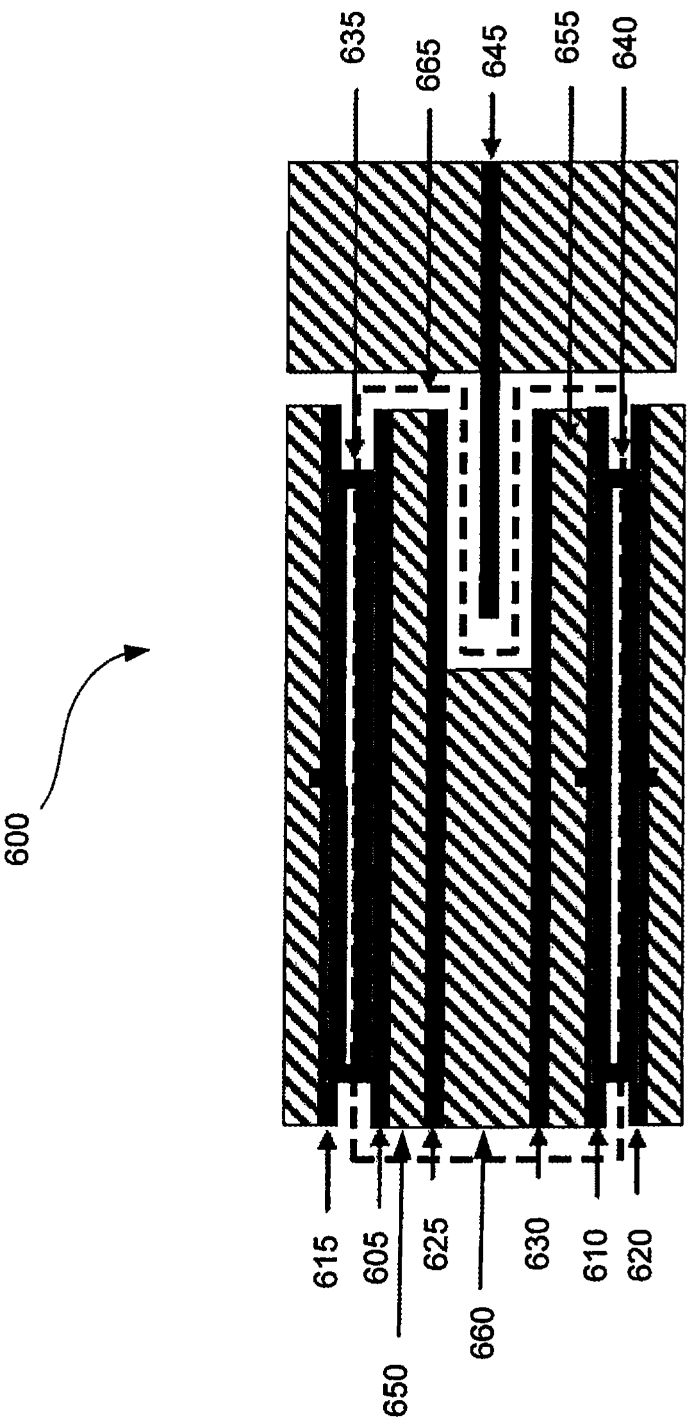
FIG. 6 is a cross-sectional view of a horizontally-actuated high-impedance MEMS switch with two bias voltages.

FIG. 6 illustrates a switch 600 for use in the continuously switched circuit 200 of FIG. 2. The switch 600 is configured to contact the sense/input node to two different bias voltages, and includes a first actuation bias terminal 605, a second actuation bias terminal 610, a first switch control terminal 615, a second switch control terminal 620, a first sense/input bias terminal 625, a second sense/input bias terminal 630, a first spring 635, a second spring 640, and a sense/input node terminal 645. The first actuation bias terminal 605 is physically coupled to and electrically isolated from the first sense/input bias terminal 625 by a first dielectric 650. The second actuation bias terminal 610 is physically coupled to and electrically isolated from the second sense/input bias terminal 630 by a second dielectric 655. A third dielectric 660 physically couples and electrically isolates the first sense/input bias terminal 625 with/from the second sense/input bias terminal 630. The first actuation bias terminal 605, the second actuation bias terminal 610, the first sense/input bias terminal 625, and the second sense/input bias terminal 630 reside in a released section 665 of the switch 600.

The first actuation bias terminal 605 is separated from the first switch control terminal 615 by a first air gap. The first sense/input bias terminal 625 is separated from the sense/input node terminal 645 by a second air gap. The second actuation bias terminal 610 is separated from the second switch control terminal 620 by a third air gap. The second sense/input bias terminal 630 is separated from the sense/input node terminal 645 by a fourth air gap. The first air gap is equal to or larger than the thickness of the first dielectric 650, and the second air gap is equal to or larger than the thickness of the second dielectric 655

The first actuation bias terminal 605 is connected to a positive DC voltage (VPOS), and the second actuation bias terminal 610 is connected to a negative DC voltage (VNEG). The first sense/input bias terminal 625 is connected to $+V_{Bias}$, and the second sense/input bias terminal 630 is connected to $-V_{Bias}$. A clock signal ø1 is applied to the first and second switch control terminals 615 and 620. The clock signal ø1 causes the voltage on the actuation bias terminals 605 and 610 to alternatively cycle between VPOS and VNEG, and the signal/input node terminal 645 to alternatively be connected to the first sense/input bias terminal 625 (and $+V_{Bias}$) and the second sense/input bias terminal 630 (and $-V_{Bias}$).

In an alternate construction, the first and second actuation bias terminals 605 and 610 are connected to a positive DC voltage (VPOS). The first sense/input bias terminal 625 is connected to $+V_{Bias}$, and the second sense/input bias terminal 630 is connected to $-V_{Bias}$. A clock signal ø1 is applied to the first switch control terminal 615, and its complement ø1Z is applied to the second switch control terminal 620. The clock signals ø1 and ø1Z cause the voltage on the actuation bias terminals 605 and 610 to alternatively cycle between VPOS and VNEG and the signal/input node terminal 645 to alternatively be connected to the first sense/input bias terminal 625 (and $+V_{Bias}$) and the second sense/input bias terminal 630 (and $-V_{Bias}$).

Figure 7:
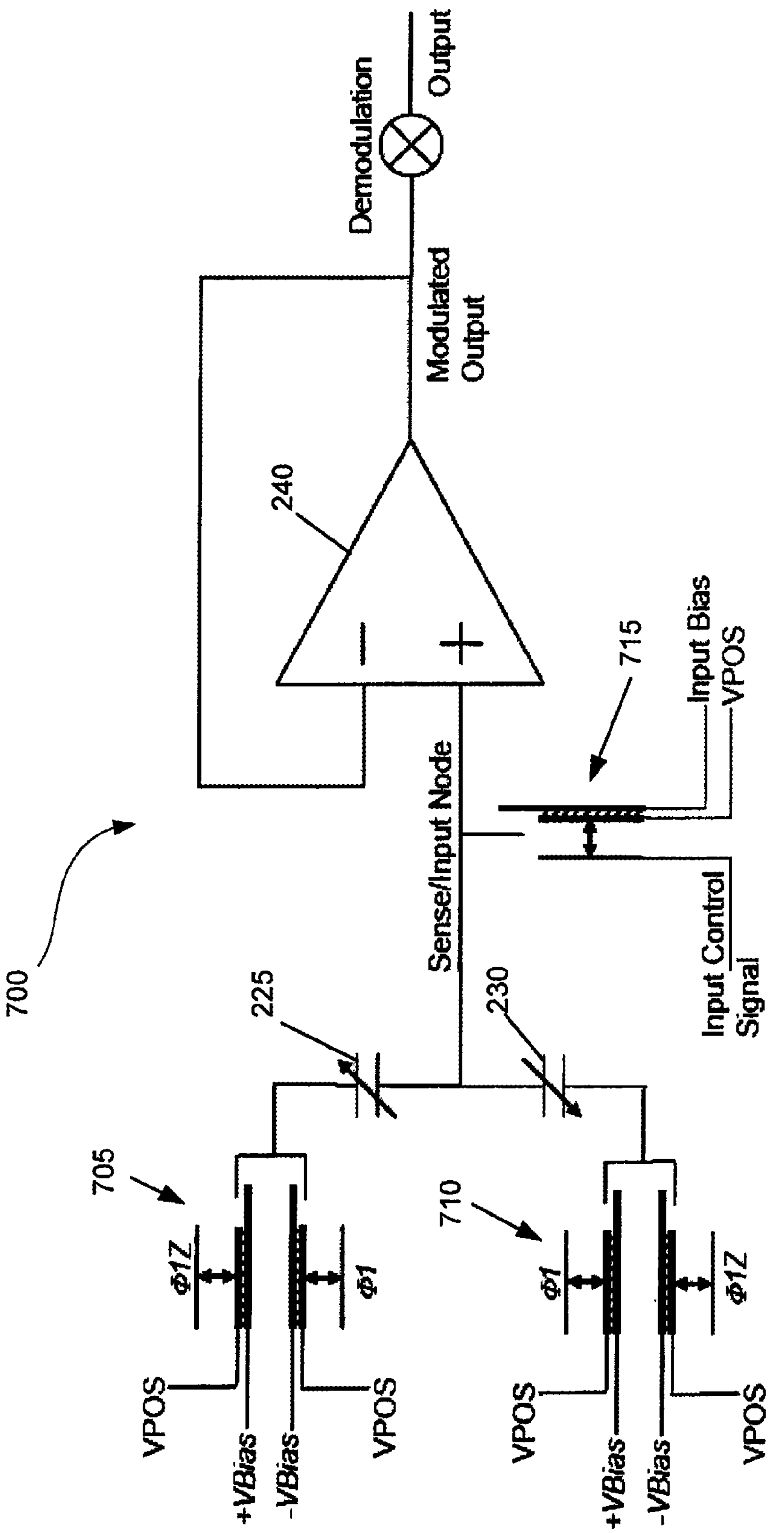
FIG. 7 is a schematic diagram of a chopper-modulated, continuous-time, voltage-sensing, front-end using the switches of FIG. 3 or 5 and 6.

FIG. 7 shows a chopper-modulated, continuous-time, voltage front-end circuit 700, similar to the circuit 200 of FIG. 2 except with the transmission gates 205-220 replaced by MEMS switches 705 and 710, and FET 235 replaced by a MEMS switch 715. MEMS switches 705 and 710 are constructed as shown in switch 600 of FIG. 6. MEMS switch 715 is constructed as shown in switch 300 or switch 300' of FIGS. 3 and 5, respectively.

In the construction shown in FIG. 7, for each switch 705 and 710, a $+V_{Bias}$ is coupled to the first sense/input bias terminal, a $-V_{Bias}$ is coupled to the second sense/input bias terminal, a positive DC voltage is applied to the first and second actuation bias terminals, and the sense/input node terminal is applied to the first or second capacitive sensor 225 or 230, respectively.

For switch 705, a clock signal ø1 is applied to the first switch control terminal, and its complement ø1Z is applied to the second switch control terminal. For switch 710, the complement clock signal ø1Z is applied to the first switch control terminal, and the clock signal ø1 is applied to the second switch control terminal.

The result is front-end circuits 400 and 700 which have reduced signal distortion, errors in signal gain, and noise as compared to circuits 100 and 200 using MOS FETs.

Various features and advantages of the invention are set forth in the following claims.

What is claimed is:

1. A MEMS switch having a high-impedance state and a low-impedance state for biasing a capacitive sensor, the switch comprising:
- an actuation bias terminal residing in a released region;
- a sense bias terminal residing in the released region and physically coupled to the actuation bias terminal by a dielectric which electrically isolates the sense bias terminal from the actuation bias terminal;
- a switch control terminal separated from the actuation bias terminal by a first air gap;
- a sense node terminal separated from the sense bias terminal by a second air gap; and
- a spring supporting the actuation bias terminal, the sense bias terminal, and the dielectric;
- wherein when a potential is created between the actuation bias terminal and the switch control terminal the actuation bias terminal is drawn towards the switch control terminal resulting in the sense bias terminal contacting the sense node terminal.

2. The MEMS switch of claim 1, further comprising a vertical wall supporting the spring.

3. The MEMS switch of claim 1, further comprising a horizontal wall supporting the spring.

4. The MEMS switch of claim 1, further comprising
- a second actuation bias terminal residing in the released region;
- a second sense bias terminal residing in the released region and physically coupled to the second actuation bias terminal by a second dielectric which electrically isolates the sense bias terminal from the actuation bias terminal;
- a second switch control terminal separated from the second sense bias terminal by a third air gap; and
- a second sense node terminal separated from the sense bias terminal by a fourth air gap.

5. The MEMS switch of claim 4, wherein a third dielectric physically couples the first and second actuation bias terminals and electrically isolates the first and second actuation bias terminals.

6. The MEMS switch of claim 5, wherein a negative DC voltage is applied to the actuation bias terminal, a positive DC voltage is applied to the second actuation bias terminal, and the same voltage is applied to the switch control terminal and the second switch control terminal.

7. The MEMS switch of claim 6, wherein the voltage applied to the switch control terminal and the second switch control terminal oscillates between the positive DC voltage and the negative DC voltage causing the sense bias terminal and the second sense bias terminal to alternatively contact the sense node terminal.

8. A capacitive sensor bias circuit, the circuit comprising:
- a capacitive sensor coupled between ground and a sense node; and
- a MEMS switch including
  - an actuation bias terminal residing in a released region and coupled to a positive DC voltage,
  - a sense bias terminal residing in the released region and physically coupled to the actuation bias terminal by a dielectric which electrically isolates the sense bias terminal from the actuation bias terminal, the sense bias terminal coupled to a bias power source,
  - a switch control terminal separated from the actuation bias terminal by a first air gap, the switch control terminal coupled to a sense control signal source,
  - a sense node terminal separated from the sense bias terminal by a second air gap, and coupled to the sense node, and
  - a spring supporting the actuation bias terminal, the sense bias terminal, and the dielectric;
- wherein the sense control signal source provides a ground potential to couple the bias power source to the sense node and provides the positive DC voltage to disconnect the sense node from the bias power source.

9. The capacitive sensor bias circuit of claim 8, wherein the spring is supported by a vertical wall.

10. The capacitive sensor bias circuit of claim 8, wherein the spring is supported by a horizontal wall.

11. The capacitive sensor bias circuit of claim 8, further comprising a coupling capacitor connected between the sense node and an input node, a second MEMS switch including a second actuation bias terminal residing in the released region and coupled to the positive DC voltage, an input bias terminal residing in the released region and physically coupled to the actuation bias terminal by a dielectric which electrically isolates the input bias terminal from the actuation bias terminal, the input bias terminal coupled to the ground, a second switch control terminal separated from the actuation bias terminal by a third air gap, the switch control terminal coupled to a input control signal source, an input node terminal separated from the input bias terminal by a fourth air gap, and coupled to the input node, and a second spring supporting the actuation bias terminal, the input bias terminal, and the dielectric;

wherein the input control signal source provides the ground potential to couple the ground to the input node and provides the positive DC voltage to disconnect the input node from the ground.

12. The capacitive sensor bias circuit of claim 11, wherein the input node is coupled to an amplifier.

13. A capacitive sensor bias circuit, the circuit comprising:

a first capacitive sensor coupled between a first bias node and a sense/input node; and a first MEMS switch including a first actuation bias terminal coupled to a first DC voltage, a first sense bias terminal coupled to a first bias power source, a first switch control terminal coupled to a first sense control signal source, a sense/input node terminal coupled to the first bias node, a spring supporting the first actuation bias terminal, and the first sense bias terminal, a second actuation bias terminal coupled to a second DC source, a second sense bias terminal coupled to a second bias source, and a second switch control terminal coupled to a second sense control signal source.

14. The capacitive sensor bias circuit of claim 13, wherein the first and second actuation bias terminals are coupled to a positive DC voltage, and the second sense control signal source supplies a voltage that is a complement of the voltage supplied by the first sense control signal source.

15. The capacitive sensor bias circuit of claim 13, wherein the first actuation bias terminal is coupled to a negative DC voltage, the second actuation bias terminal is coupled to a positive DC voltage, and the first and second sense control signal sources supply the same voltage to the first and second switch control terminals.

16. The capacitive sensor bias circuit of claim 13, further comprising an amplifier coupled to the sense/input node.

17. The capacitive sensor bias circuit of claim 13, further comprising a second capacitive sensor coupled between a second bias node and the sense/input node;

a second MEMS switch including a third actuation bias terminal coupled to the first DC voltage, a third sense bias terminal coupled to the first bias power source, a third switch control terminal coupled to the second sense control signal source, a second sense/input node terminal coupled to the second bias node, and a second spring supporting the third actuation bias terminal, and the third sense bias terminal;

a fourth actuation bias terminal coupled to the second DC source;

a fourth sense bias terminal coupled to the second bias source; and a fourth switch control terminal coupled to the first sense control signal source.

* * * * *